United States Patent
Klewer et al.

(10) Patent No.: US 10,141,581 B2
(45) Date of Patent: Nov. 27, 2018

(54) METHOD FOR THE DEPASSIVATION OF A LITHIUM-THIONYL BATTERY, A DEVICE FOR CARRYING OUT THE METHOD, AND A BATTERY DEVICE

(71) Applicant: MSA Europe GmbH, Jona (CH)

(72) Inventors: Rene Klewer, Berlin (DE); Ansgar Schmidt, Berlin (DE); Thomas Schneider, Fuerstenwalde (DE)

(73) Assignee: 4114, Jona (CH)

( * ) Notice: Subject to any disclaimer, the term of this patent is extended or adjusted under 35 U.S.C. 154(b) by 87 days.

(21) Appl. No.: 15/300,862

(22) PCT Filed: Mar. 31, 2015

(86) PCT No.: PCT/EP2015/057046
§ 371 (c)(1),
(2) Date: Sep. 30, 2016

(87) PCT Pub. No.: WO2015/150393
PCT Pub. Date: Oct. 8, 2015

(65) Prior Publication Data
US 2017/0025686 A1 Jan. 26, 2017

(30) Foreign Application Priority Data

Apr. 3, 2014 (DE) .......................... 10 2014 206 470

(51) Int. Cl.
*G01R 31/36* (2006.01)
*H01M 6/50* (2006.01)
*H01M 6/14* (2006.01)
*H01M 4/36* (2006.01)
*H01M 4/82* (2006.01)

(52) U.S. Cl.
CPC ...... *H01M 6/5088* (2013.01); *G01R 31/3651* (2013.01); *H01M 6/14* (2013.01); *H01M 6/5044* (2013.01); *H01M 6/5083* (2013.01); *H01M 4/368* (2013.01); *H01M 4/82* (2013.01)

(58) Field of Classification Search
USPC .................................. 324/426–437, 130–131
See application file for complete search history.

(56) References Cited

U.S. PATENT DOCUMENTS

2012/0268074 A1* 10/2012 Cooley .................. H01G 11/58
 320/130
2015/0171655 A1* 6/2015 Venkataramani ..... H02J 7/0075
 320/131

FOREIGN PATENT DOCUMENTS

CN 102097663 A 6/2011

* cited by examiner

*Primary Examiner* — Vincent Q Nguyen
(74) *Attorney, Agent, or Firm* — The Webb Law Firm (57) ABSTRACT

A method for depassivation of a lithium-thionyl battery includes applying at least one current test load (LAST) (101) to an electrode of the battery (10), wherein at least one of a shape, a magnitude or points in time of the application of the at least one current test load (LAST) occurs dependent on a measurement of a response signal (u(t), du(t) on the battery (10), and energy of the at least one current test load (LAST) is drawn from the battery (10), comparing the response signal (u(t), du(t) of the battery (10) arising from application of the at least one current test load (LAST) to at least one predefined criterion (103), and establishing an operating state (12) or issuing an error message depending on satisfaction of the at least one predefined criterion (103).

16 Claims, 7 Drawing Sheets

METHOD FOR THE DEPASSIVATION OF A LITHIUM-THIONYL BATTERY, A DEVICE FOR CARRYING OUT THE METHOD, AND A BATTERY DEVICE

CROSS-REFERENCE TO RELATED APPLICATIONS

This application is the United States national phase of International Application No. PCT/EP2015/057046 filed Mar. 31, 2015, and claims priority to German Patent Application No. 10 2014 206 470.8 filed Apr. 3, 2014, the disclosures of which are hereby incorporated in their entirety by reference.

BACKGROUND OF THE INVENTION

The following information is provided to assist the reader in understanding technologies disclosed below and the environment in which such technologies may typically be used. The terms used herein are not intended to be limited to any particular narrow interpretation unless clearly stated otherwise in this document. References set forth herein may facilitate understanding of the technologies or the background thereof. The disclosure of all references cited herein are incorporated by reference.

Field of the Invention

The invention relates to a method for the depassivation of a lithium-thionyl battery, to a device for carrying out the method, and to a battery device.

Description of Related Art

In the known, non-rechargeable lithium-thionyl batteries, reactions according to the following scheme occur:

Positive reaction:

$$2\ SOCl_2 + 4\ Li^+ + 4\ e^- \rightarrow 4\ LiCl + S + SO_2$$

Negative reaction:

$$Li \rightarrow Li^+ + e^-$$

Overall reaction:

$$2\ SOCl_2 + 4\ Li \rightarrow 4\ LiCl + S + SO_2$$

The lithium-thionyl batteries have a very low self discharge rate, so that they are ready for operation even after along storage time. The reason for the low self discharge rate, is the formation of a passivation layer with LiCl crystals (see right side of the overall reaction) on the lithium anode.

If a load is applied to the lithium-thionyl battery, a relatively strong drop of the voltage occurs, which is disadvantageous. This voltage drop is also referred to as Transient Minimum Voltage (TMV). In the process, this voltage drop can become sufficiently large so that the voltage drops at least temporarily below the respective cut-off voltage.

SUMMARY OF THE INVENTION

Therefore, the goal of the present invention is to provide methods and devices that have a good operational behavior even under load.

This is achieved with a method for the depassivation of a lithium-thionyl battery according to Claim 1.

Here, first, at least one current test load is applied to an electrode of the battery, wherein the shape, magnitude and/or points in time of the application of the at least one current test load occur(s) dependent on a measurement of a time-dependent response signal u(t), du(t) on the battery, and energy of the current test load is drawn from the battery itself. As a result of the removal of the energy from the battery itself, it is not required or necessary to use external energy sources. The response signal can be, for example, a time-dependent voltage u(t) or also a derived variable, such as a voltage difference du(t).

Subsequently, the comparison of a response signal u(t), du(t) of the battery to the at least one current test load to at least one predefined criterion is carried out.

Then, depending on satisfaction of the at least one criterion, the establishment of the operating state or the issuing of an error message occurs. In the case of use in connection with a gas sensor, the gas sensor, for example, is activated, so that it is able to measure. If an error is detected, an error message is issued.

Here, in an embodiment of the method, the current test load can have at least one pulse load of a current variable, at least one step change in load of a current variable, an alternating signal of a current variable and/or at least one ramp change in load of a current variable. Current variable here can be understood to be either a voltage or also a current flow. Here, the pulse load does not refer to the mathematical definition of the pulse, but to the technical-physical definition, i.e., a short signal with a high amplitude. For example, an alternating signal can be understood to be a sine signal.

Moreover, in an embodiment, the response du(t) of the battery can be determined by determining the difference in the response to two pulse loads, a predetermined number of current test loads, a level of the applied current test loads and/or a drop below a minimum value for a difference between voltage drops.

Here, the at least one criterion can have
- at least one temporal component, in particular the elapse of a preset minimum or maximum duration,
- at least one load component, which relates to current test load and/or
- at least one response component, which relates to the response signal u(t), du(t).

In principle, the at least one criterion can have one condition or several logically interlinked conditions.

In an embodiment of the method, when a first criterion is verified, then it is possible to determine whether the elapse of a certain time, a predetermined number of cycles of the application of the current test load and/or a predetermined value or course for the response signal u(t), du(t) has/have been reached.

In an additional or alternative embodiment, it is possible to calculate from the response signal u(t), du(t) of the battery, a change variable ddu(t), in particular a difference ddu(t) between two voltage drops from the response signal du(t):

$$ddu(t2) = du(t2) - du(t1),$$

Using this change variable, it is possible to determine, for example, whether the response signal converges to a limit value.

Here it is possible, in particular, to verify whether the temporal change variable ddu(t) has reached a predetermined threshold and/or whether a predetermined time has elapsed.

In an embodiment, depending on satisfaction of the at least one criterion, in particular of the first criterion and/or of the second, the establishment of the operating state will occur or an error message is generated.

In an embodiment, the establishment of the operating state or the generation of the error message is carried out dependent on the current test load.

The method can be implemented autonomously, if the total energy required for carrying out the depassivation method is drawn exclusively from the battery.

The problem is also solved with a device and method according to the claims. The device comprises a means or mechanism for the targeted application of a current test load and a means or mechanism for verifying at least one criterion.

In particular, in an embodiment of the device, a feedback control device for a current variable, in particular a voltage, takes over, in addition, the control of the current test load. Here, the feedback control device controls the issuing of the current test load based on magnitude and/or time, wherein the energy of the current test load originates only from the battery.

In an additional embodiment, the feedback control device in particular is connected to an observer device for the determination of a change variable ddu(t), in particular a difference ddu(t) between two voltage drops of the response signal du(t)

$$ddu(t2)=du(t2)-du(t1).$$

Here, the embodiments of the device are connected to a gas measurement device, a defibrillator, a pacemaker, an electrical measurement device (for example, toll system, water detector, fire detector, current detector) or emergency lighting. All these apparatuses also must be reliably and rapidly ready for operation even after a longer storage time. These apparatuses are electrically self sufficient.

In an embodiment of the device, it is appropriate to measure a current variable level, in particular a current intensity for a time between 1 ms and 10 minutes, in particular between 1 ms and 30 ms, and subsequently there is a wait period which lasts a predetermined time (T) between 10 ms and 25 min, in particular between 75 ms and 500 ms.

In an autonomous embodiment of the device, the energy supply of the device is provided only by the battery.

The aim is also achieved by a battery device that is connected to a device for depassivation. Here, the energy supply for the depassivation and the energy supply for the additional operation of the battery device are provided autonomously by the battery. During the operation, the battery device not only delivers energy, but it also requires some energy for its own operation. Thus, it must be ensured that, for example, there is no drop below certain limit voltages, which would lead to a resetting of the battery device.

Embodiments pertaining to the methods and to the devices are explained in reference to the figures.

The present methods, systems and devices, along with the attributes and attendant advantages thereof, will best be appreciated and understood in view of the following detailed description taken in conjunction with the accompanying drawings.

DETAILED DESCRIPTION OF THE INVENTION

It will be readily understood that the components of the embodiments, as generally described and illustrated in the figures herein, may be arranged and designed in a wide variety of different configurations in addition to the described representative embodiments. Thus, the following more detailed description of the representative embodiments, as illustrated in the figures, is not intended to limit the scope of the embodiments, as claimed, but is merely illustrative of representative embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As used herein and in the appended claims, the singular forms "a," "an", and "the" include plural references unless the context clearly dictates otherwise. Thus, for example, reference to "a criterion" includes a plurality of such criteria and equivalents thereof known to those skilled in the art, and so forth, and reference to "the criterion" is a reference to one or more such criteria and equivalents thereof known to those skilled in the art, and so forth. Recitation of ranges of values herein are merely intended to serve as a shorthand method of referring individually to each separate value falling within the range. Unless otherwise indicated herein, and each separate value, as well as intermediate ranges, are incorporated into the specification as if individually recited herein. All methods described herein can be performed in any suitable order unless otherwise indicated herein or otherwise clearly contraindicated by the text.

The passivation layer on an electrode, particularly of the anode of a lithium-thionyl battery 10, can be removed or at least reduced, which is referred to as depassivation. The depassivation can take place under current flow, wherein, on the one hand, the current flow should be sufficiently high in order to reach a time-efficient depassivation. On the other hand, the current flow should be sufficiently low, so that the undesired voltage drop (TMV) has no negative effect or the least possible negative effect on the operating behavior. If, one considers a current flow (that is the effect of an applied voltage) here, this can also be expressed alternatively in the form of a voltage (i.e., the cause); both are here also referred to as current variable.

Figure 1:
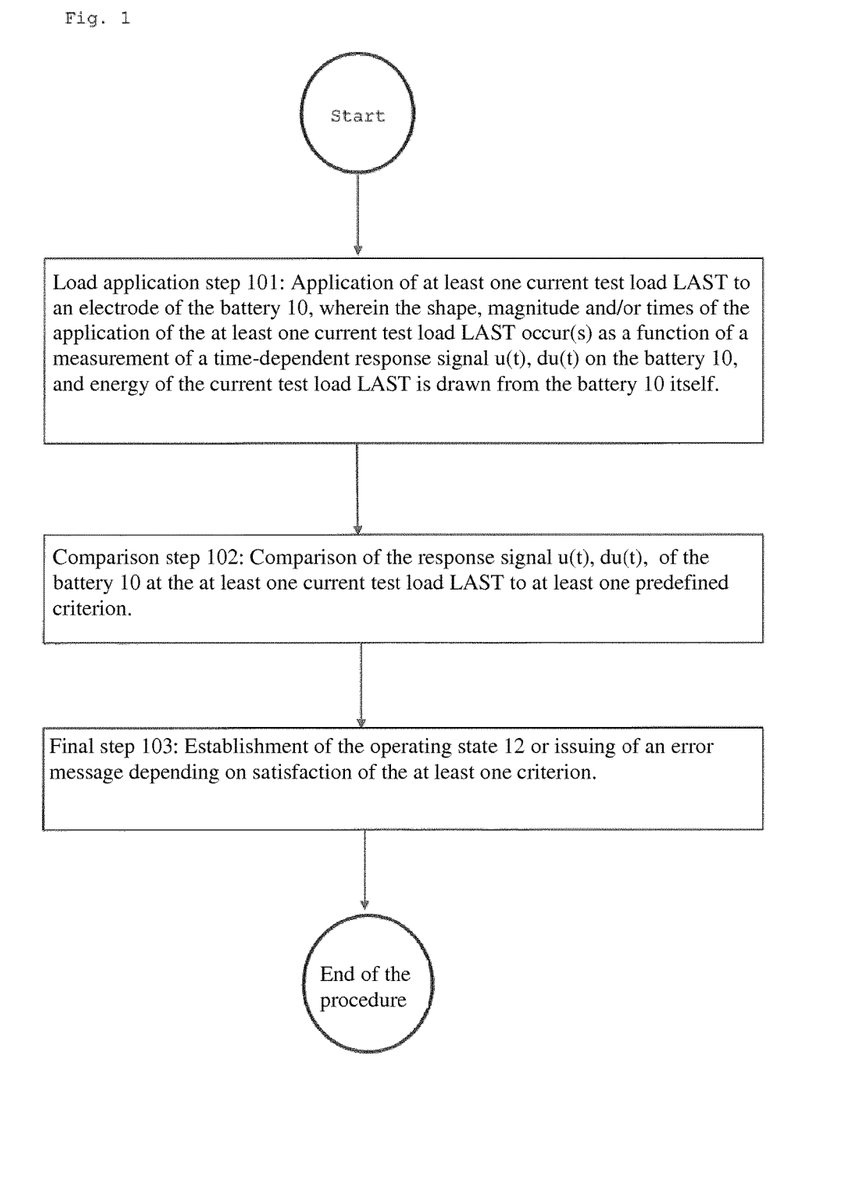
FIG. 1 is a flow chart of a first embodiment of a method according to the principles of the present invention.
Figure 3:
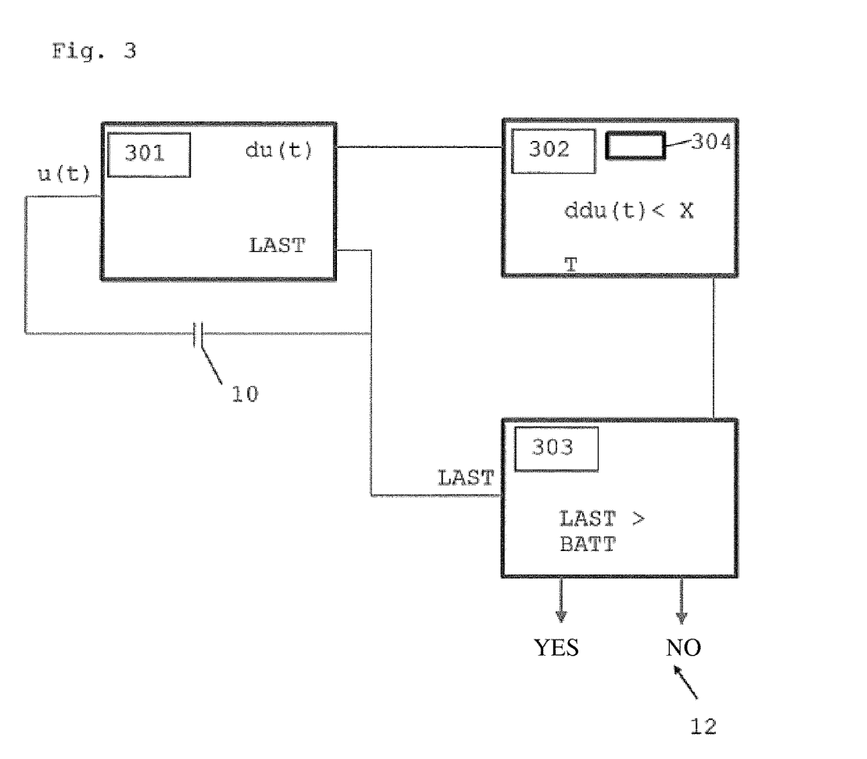
FIG. 3 is a schematic view of an embodiment of a device for carrying out a depassivation according to the principles of the present invention.

In FIG. 1, a first embodiment of a method of the present invention is described, by means of which an efficient depassivation becomes possible. In FIG. 3, a device is described in which a feedback control device 301 is provided, by means of which the first embodiment can be carried out.

For this purpose, in a first step 101 (load application step), at least one current test load (LAST) is applied to an electrode of the battery (10), wherein the shape, magnitude and/or the points in time of the application of the at least one current test load LAST occur(s) dependent on a measurement of a time-dependent current variable (current flow variable or voltage variable), namely the response signal u(t), du(t), on the battery 10. In addition, the energy for the current test load LAST is drawn from the battery 10 itself, so that no external current supply is required. If a current test load LAST is used here, this can be a load in the form of a voltage or a current flow. The current test load LAST (i.e., an input signal) can here have continuous or temporally discontinuous shapes, such as pulses, for example.

By the application of the temporally variable current test load LAST, for example, in the form of a pulse, the passivation layer is reduced over the course of time, wherein the remaining steps of the method are used to determine when the decomposition can be stopped. Other possible shapes of the current test load LAST are at least one step change in load of a current variable and/or at least one ramp change in load of a current variable. The current test loads LAST can here be combined with one another in a temporal sequence.

After the load application step 101, the response signal du(t) versus time of the battery 10 to the at least one current test load LAST is compared to at least one predefined criterion, in a comparison step 102. The at least one criterion can have several components:

- temporal components (for example, elapse of a preset minimum or maximum duration)
- components that relate to the current test load LAST (for example, number of pulses)
- components that relate to the response signal du(t).

From these components, complex criteria can be formed, in order to find the appropriate moment for termination of the depassivation. Moreover, examples pertaining to this are provided below.

In a final step 103, the establishment of the operating state 12 occurs depending on satisfaction of at least one criterion 103. If the depassivation has not been successful for any reason, an error message is issued.

By means of such a method, a depassivation can be carried out in situ without an external energy source.

Figure 2:
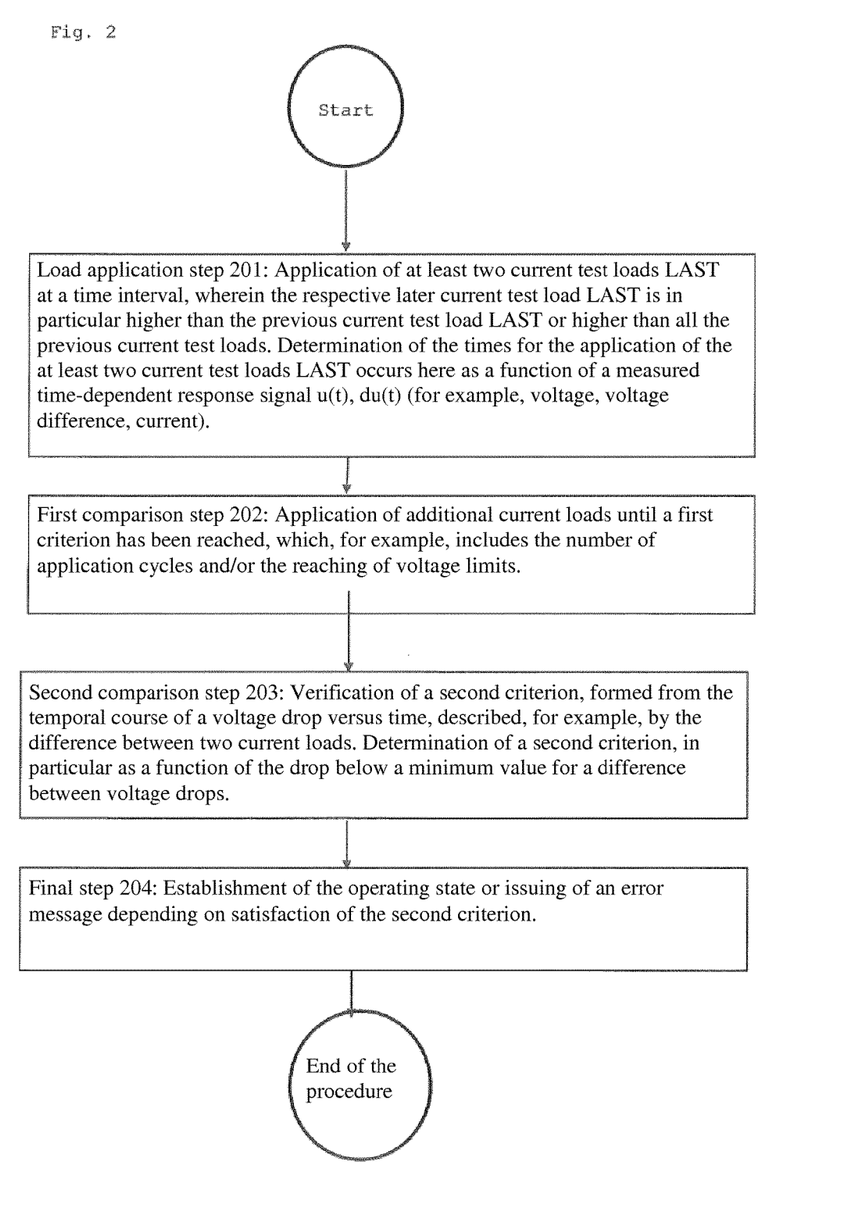
FIG. 2 is a flow chart of a second embodiment of a method according to the principles of the present invention.

FIG. 2 provides a diagrammatic representation of an additional embodiment of a method by means of which an efficient depassivation becomes possible. Here, four steps 201, 202, 203, 204 are carried out and in particular two criteria are verified.

In a first step 201 (load application step), at least two current loads are applied as current test loads LAST at a time interval to the anode of the battery 10, wherein in particular the second current load is higher than the previous current load or all the previous current loads. As a result, a step-like formation of current test loads LAST is obtained.

Here, the points in time for the application of the at least two current loads are determined dependent on a measured response signal du(t), such as, for example, a voltage, a voltage difference or a current flow.

However, the application of the current loads to the anode occurs (first comparison step 202) until a first criterion has been reached. As explained in detail in connection with FIG. 4, this first criterion can include a maximum number of applied current loads, among other factors. The first criterion can also include additionally or alternatively the reaching of certain voltage limits.

Figure 7:
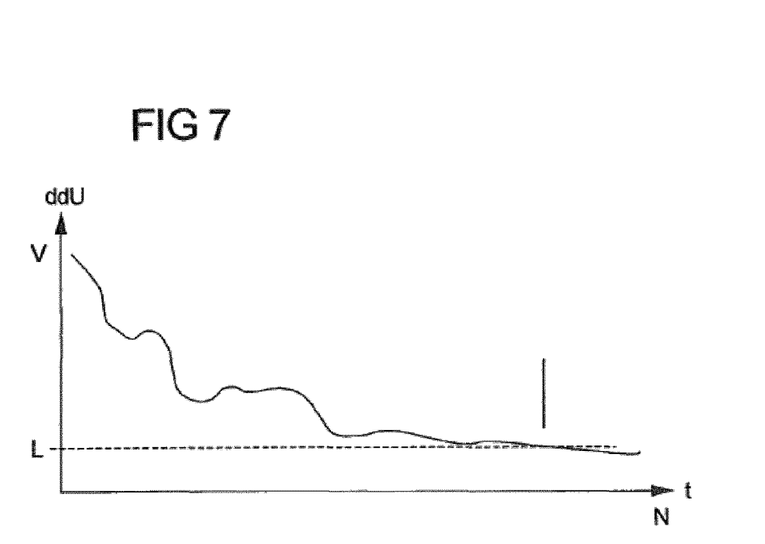
FIG. 7 is a graph of a representation of the decrease in the differences of voltage drop ddu versus time.

However, the operating state (final step 204) is not already established after satisfaction of the first criterion; instead, in addition, a second criterion (second comparison step 203) is formed from the course of the voltage drop du(t) versus time (see FIG. 7, for example). Here, an increase in the performance of the battery 10 is possible especially under marginal temperature ranges (very cold/warm). In addition, an increase in the repassivation time of the battery 10 and thus a more meaningful battery status display for the user can be achieved.

This is described in further detail in connection with FIG. 5.

In FIG. 3, an embodiment of a device is described by means of which the embodiments of the method of the present invention can be carried out.

In the represented embodiment, a feedback control device 301 is used in order to keep the voltage u(t), which is applied to the battery 10, within a certain range.

The feedback control device 301 is used moreover to control the application of the current test load LAST. Here, the energy for the current test load LAST is drawn from the battery 10. If the current test load LAST (for example, a sequence of current pulses) is applied to the battery 10, then said battery responds with the time-dependent response signal du(t). The shape, magnitude and/or the point in time of the application of the current test load LAST occur(s) dependent on a measurement of a time-dependent current variable, namely the response signal du(t) on the battery 10.

This response signal du(t) is also provided as an output variable of the feedback control device 301.

In principle—as represented, for example, in connection with FIG. 1—it is possible that the depassivation is controlled solely on the basis of the verification of the response signal du(t) and of a comparison with a predefined criterion. In this manner, the reaching of a certain threshold of the response signal du(t) within a certain time period and/or the application of a certain number of load pulses can be used as criterion.

In principle, the feedback control device 301 always continues to operate, wherein the control of the current test load LAST occurs subject to the first criterion.

The design of the device according to FIG. 3 is slightly more complex, because, in addition to the feedback control device 301, the latter is connected to an observer device 302, which has the response signal du(t) as input values. Here, the observer device 302 uses a calculator 304 in order to calculate the change variable ddu(t), for example, difference values from the response signal du(t). A possible model for the calculation of the change variable is:

$$ddu(t2) = du(t2) - du(t1).$$

This means that the difference of the response signal du(t) is calculated at two specific points in time t1, t2. If this difference ddu(t) is, for example, smaller than a predetermined threshold X, then the depassivation can be interrupted, and the operational readiness can be established.

This corresponds to a second criterion, as described, for example, in connection with FIG. 2. Alternatively or additionally, the second criterion can also have a time condition, i.e., a maximum duration.

The observer device 302 uses no information on the current test load LAST.

The actual decision regarding the establishment of the operating state is made in a decision device 303 in which the information on satisfaction/absence of satisfaction of the second criterion and information on the current test load LAST come together.

The decision device 303 here verifies whether the current test load LAST is greater than or equal to the minimum performance capacity of the battery 10 (Nbat>Ngood). Furthermore, a verification (step 302) is carried out to determine whether the minimum number of test load cycles has been run with the positive result from the observer device.

Figure 4:
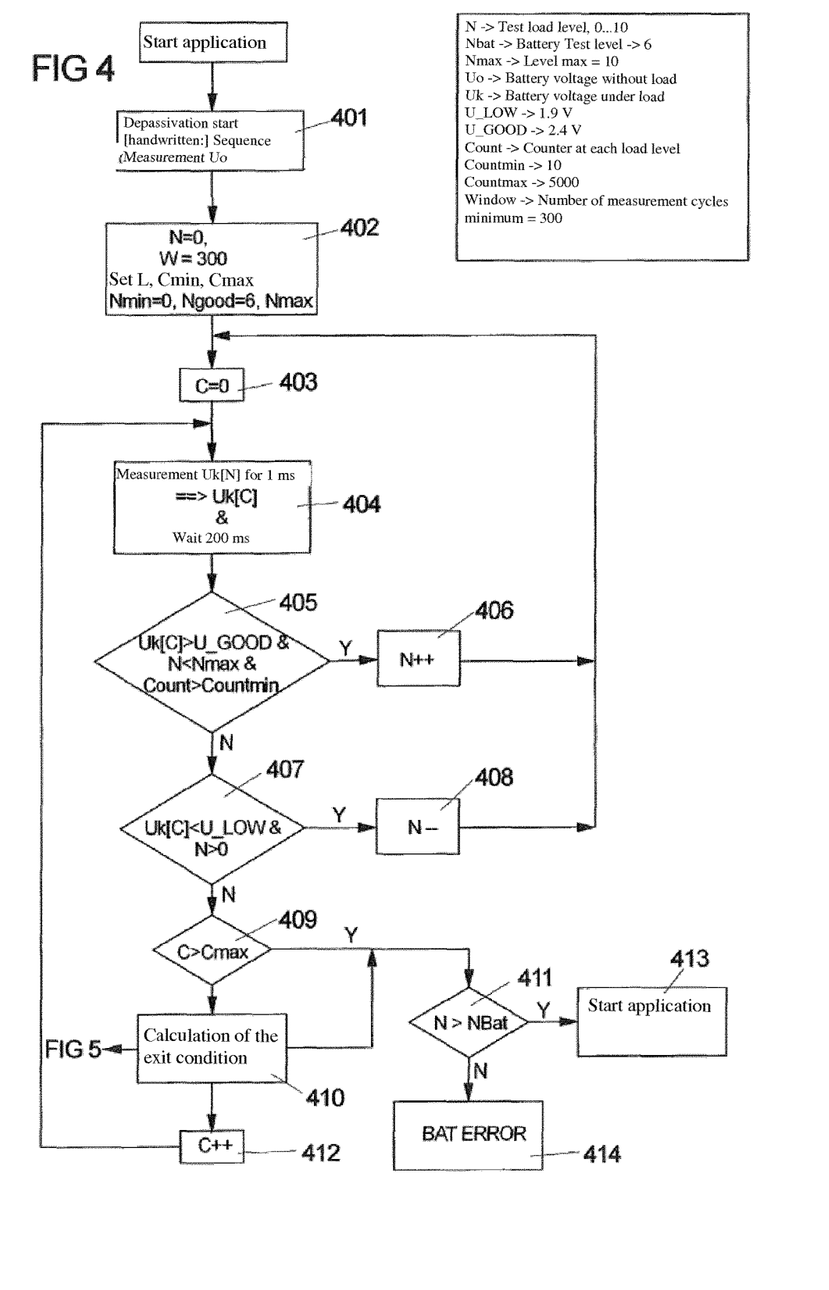
FIG. 4 is a flow chart of a first portion of an embodiment of the method described in FIG. 1.

In FIG. 4, an embodiment of the first two steps 101, 102 of FIG. 1 and of the steps 201, 202 of FIG. 2 is described in detail.

For this purpose, in a first step 401, the depassivation is started and the voltage U0 (voltage without application of a current test load LAST; open-loop voltage) is measured.

In step 402, a minimum value W for a number of measurement cycles (here a window size of W=300) and a current intensity level N for the current loads (here N=0) is established. Moreover, additional needed parameters are also set subsequently.

In alternative embodiments, the current intensity level N for the current loads can also begin at a value N that is not equal to 0. In the context of the depassivation method described here, the current load level is successively increased, as represented, for example, in FIG. 6. It is stipulated, for example, that at least one Ngood=6 has to be reached, in order to establish the operating state (see step 413 in FIG. 5). Technically, this represents the level N which can actually occur in the later application and therefore has to be satisfied. Thus: level N>Nbat=6 (see step 411 in FIG. 5). Otherwise, the error state in step 414 of FIG. 5 is triggered.

Figure 5:
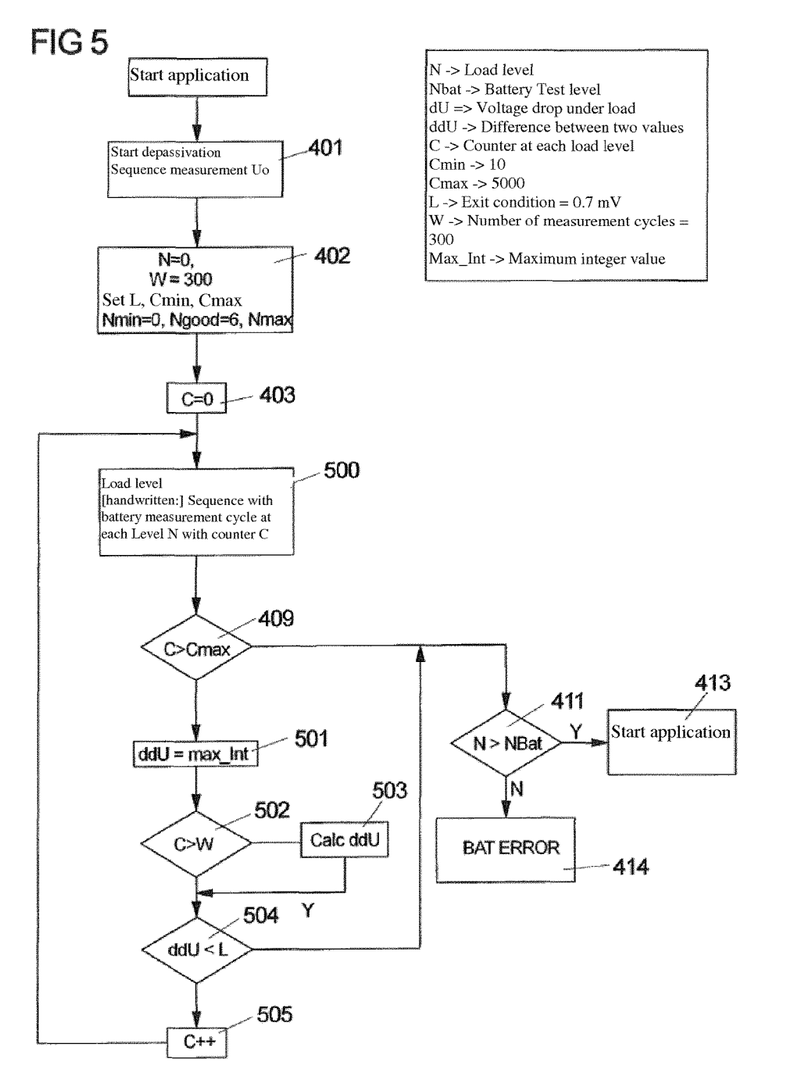
FIG. 5 is a flow chart of a second portion of the embodiment of the method described in FIG. 2.
Figure 6:
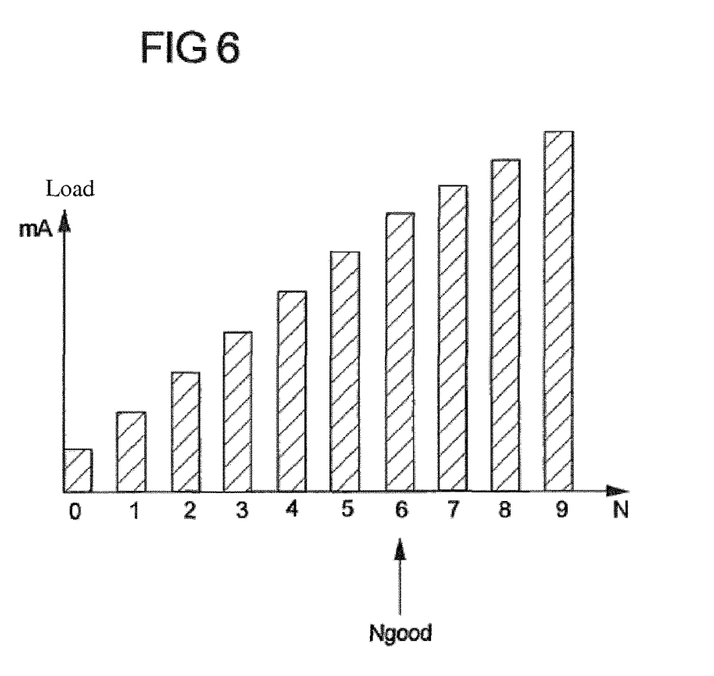
FIG. 6 is a graph of a representation of a successively increasing current load level.

The increase here is controlled by the steps represented in FIGS. 4 and 5.

In the represented embodiment, the value for current intensity level can be 0 to Nmax=10.

In step 403, a counter for the number of current loads C to be applied for each measurement cycle is set to zero. A measurement cycle includes the application of current loads of a certain current intensity level N.

In step 404, the voltage Uk for the respective set current intensity level N is measured, namely for 10 ms. The time period for the measurement can be, for example, between 1 ms and 10 min.

This measurement value is referred to as Uk(C). Subsequently, there is a wait period lasting a predetermined time T. Here T=200 ms. The wait time can be between 10 ms and 24 h.

After the wait time, in step 405, the measured value Uk is compared to the good value U_GOOD. Additionally, a verification is also carried out to determine whether a maximum value Nmax (here Nmax=10) for the current intensity level N has been reached and whether the current counter value C is greater than the minimum counter value Cmin.

In the represented embodiment, all three conditions are combined to form a first criterion. If all three conditions are satisfied together (i.e., the first criterion has been satisfied), an increase of the current load level N occurs in step 406 as does a return to step 403, i.e. a new measurement cycle is started.

In alternative embodiments, each one of the three mentioned conditions alone or any desired sub-combination can be used as first criterion in step 405. Here, the ambient temperature can also be included as criterion.

If the first criterion in step 405 is not satisfied, a verification is conducted to determine whether the currently measured voltage Uk(C) is smaller than a minimum voltage U_LOW (here U_LOW=1.9 V) and the current load level N is greater than zero. If the two conditions are satisfied, the current load level N in step 408 is decreased by one increment, wherein subsequently a return to step 403 occurs, i.e., a new measurement cycle is started.

If the actually measured voltage Uk(C) is greater than the minimum voltage U_LOW (here U_LOW=1.9 V) and the current load level N is greater than zero, a verification is carried out in step 409 to determine whether the counter C is greater than a maximum counter value state Cmax. Here C=5000 is set.

The steps described so far can be implemented, for example, in the feedback control device 301, which is described in FIG. 3; i.e., these steps do without the observer device 302.

The feedback control device 301 is here linked to a decision device 303, by means of which additional steps 411, 413, 414 can be carried out.

If the maximum number of the current loads Cmax has been reached, a verification is carried out in step 411, to determine whether a battery level NBat has been reached (here Ngood=6). If this applies, the operating state is established in step 413. Otherwise, a "Bat Error" message is issued (step 414).

If the maximum number of the current loads Cmax has not yet been reached (C<Cmax), then an additional calculation is carried out, which is described in greater detail in connection with FIG. 5.

In order to clarify the embedding in the overall method, in FIG. 5 the steps 401, 402, 403, 409, 411, 413, 414 from FIG. 4 are represented again. In FIG. 5, the steps 404, 405, 406, 407, 408 from FIG. 4 are combined as step 500.

If, in step 409, the current number of the current loads C is equal to Cmax, then—as described in FIG. 4—the continuation consists of step 411 and the verification N>NBat.

If, in step 409, the current number of the current loads C is smaller than Cmax, then, in step 501, a variable ddU is set for the starting variable ddU=max_int (maximum whole number available in the process computer).

Subsequently, in step 502, a verification is carried out to determine whether the current number of the current loads C is greater than the number of the measurement cycles W.

If this applies, the variable ddU is calculated according to the following determination equation $$ddU = \text{MAX}(0, dU(C-W) - dU(C))$$

in step 503. Thus, the difference between two current drops under current load is calculated, namely between the current drop dU(C-W) and the current drop dU(C). The function MAX ensures that this difference—if it is greater than zero—is set as new variable ddU. The window W ensures that the process is carried out with a minimum number of the current load level N and it is only then (for example, after 300 cycles) that the ddU value is evaluated, in order to obtain a meaningful result for the assessment. The reason for this is that the change of the ddU value is very slightly above the number of the measurements.

Subsequently, in step 504, verification is carried out to determine whether ddU is smaller than an abort criterion L (set beforehand), which here was set at 0.7 mV. Passivated anodes show an increasing battery voltage with unchanging load level, so that ddU in this case becomes greater than L. Nearly depassivated batteries show an approximately constant battery voltage under equal loads, and the differences between the voltage drops become smaller and smaller over time (see FIG. 7).

It is evident from FIG. 7 that the battery voltage u(t) at constant load converges to a value. This leads, on the one hand, to a continuously decreasing ddU, leading to aborting in the case of a verification against L. If, at the end of a 300th cycle, ddU is not smaller than L, then the reason may be that the battery is discharged and the battery voltage continues to decrease, or the battery has not yet been depassivated sufficiently.

In the case of a fall below the abort criterion L, the difference between the voltage drops ddU is sufficiently small, the depassivation is stopped, and a decision is made (see step 411 in FIG. 4) as to whether the operating state is activated (step 413) or an error message (step 414) is issued. In the case of a fall below L, this provides information on whether or not the cell has been sufficiently depassivated to be able to be used.

The same verification occurs if the current number of current loads C is less than or equal to W (number of the measurement cycles).

Subsequently, in step 505, the counter C for the number of current loads is increased, and the return to step 500 occurs.

Steps 501 to 505 here correspond to the second comparison step 203 of FIG. 2. At the same time, it is also possible for these steps to be implemented in an observer device 302 as represented in FIG. 3.

Figure 8:
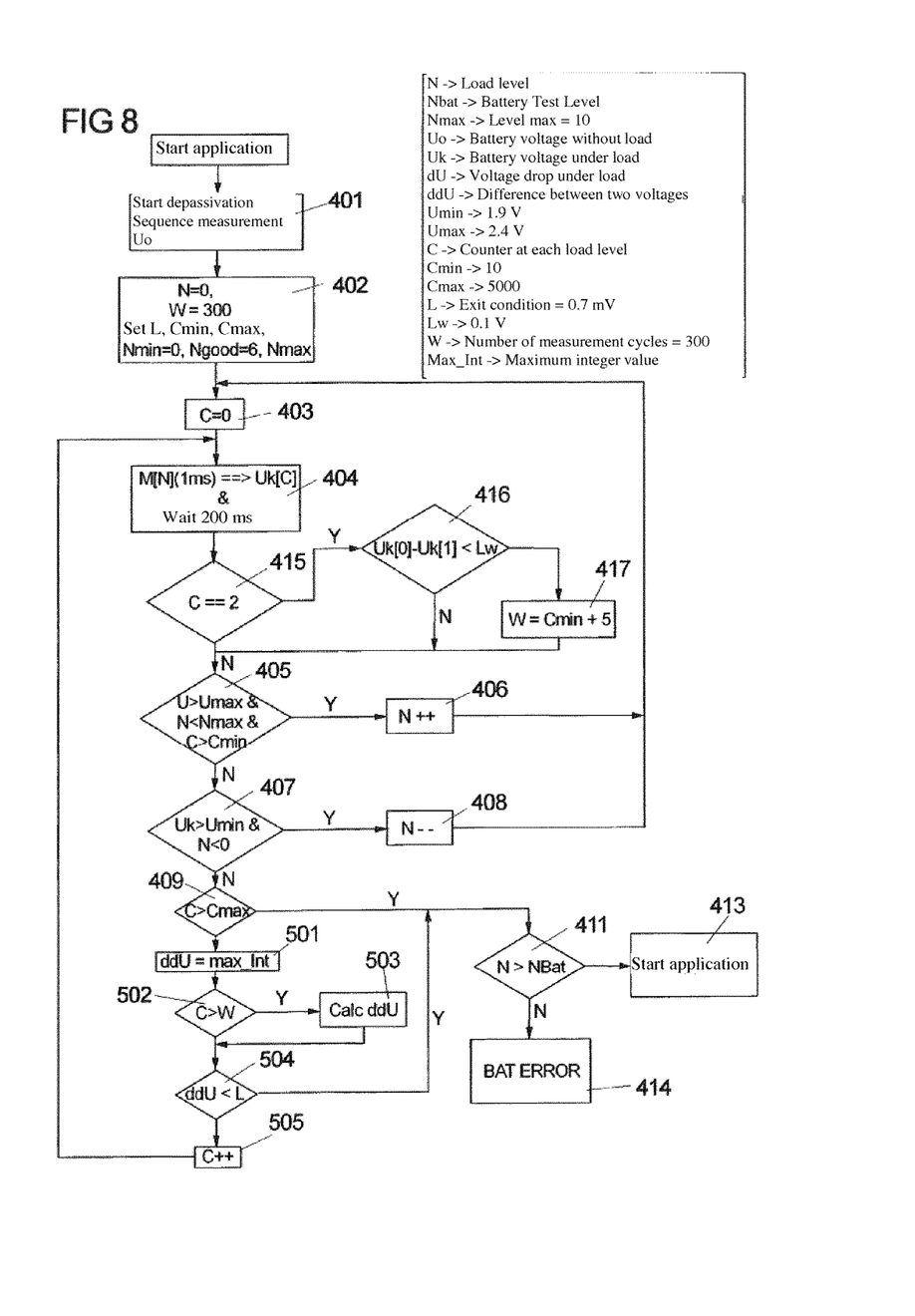
FIG. 8 is a flow chart of a summary representation of an embodiment of the method according to the principles of the present invention.

In FIG. 8, the process steps from FIGS. 4 and 5 are represented again in context, so that reference can be made essentially to the above description.

However, here, after step 404, yet another verification is carried out in step 415, namely to determine whether C=2. If this is the case, an additional verification is carried out in step 416, to determine whether the condition $$Uk(0)-Uk(1)<Lw$$

has been satisfied. If this is the case, then the variable W for the window is increased: W=Cmin+5. Subsequently—exactly as in the case when the condition in step 416 has not been satisfied—a return to step 405 occurs. By means of these additional steps 415, 416, 417 it is possible to distinguish between a strongly passivated battery and an actually discharged battery, in order to rapidly and reliably provide feedback to the user.

The foregoing description and accompanying drawings set forth a number of representative embodiments at the present time. Various modifications, additions and alternative designs will, of course, become apparent to those skilled in the art in light of the foregoing teachings without departing from the scope hereof, which is indicated by the following claims rather than by the foregoing description. All changes and variations that fall within the meaning and range of equivalency of the claims are to be embraced within their scope.

LIST OF REFERENCE NUMERALS

10 Battery
12 Operating state flag (Yes/No)
101 Load application step
102 Comparison step
103 Final step
201 Load application step
202 First comparison step
203 Second comparison step
204 Final step
301 Feedback control device
302 Observer device
303 Decision device
304 Calculator
C Number of current loads per measurement cycle
Cmin Minimum number of the current loads
Cmax Maximum number of the current loads
du(t) Response signal, voltage drop under load
ddu(t) Change variable
ddU Change variable (instantaneous value)
L Abort criterion
LAST Current test load
N Current intensity level
Ngood Number of the lowest current test level to be reached
Nmax Maximum current intensity level
Nmin Minimum current intensity level
NBat Battery level
u(t) Response signal, voltage
$U_0$ Voltage at the start of the method
U_GOOD Good voltage
U_LOW Minimum voltage
Uk(C) Voltage for the respective current intensity level
W Number of the measurement cycles

What is claimed is:

1. A method for depassivation of a lithium-thionyl battery, comprising:
 a) applying at least one current test load (LAST) to an electrode of the battery, wherein at least one of a shape, a magnitude, or a point in time of the application of the at least one current test load (LAST) occurs dependent on a measurement of a time-dependent response signal (u(t), du(t)) on the battery, and energy of the current test load (LAST) is drawn from the battery,
 b) comparing the response signal (u(t), du(t)) of the battery arising from application of the at least one current test load (LAST) to at least one predefined criterion, and
 c) establishing an operating state or issuing an error message depending on satisfaction of the at least one predefined criterion,
 wherein a temporal change variable (ddu(t)) is calculated as a difference between a response signal (du(t2)) at time t2 and a response signal (du(t1)) at time t1 as: ddu(t2)=du(t2)−du(t1), and
 wherein a second predefined criterion comprises verifying at least one of (a) whether the temporal change variable (ddu(t)) has reached a certain threshold (X) or (b) whether a predetermined time (T) has elapsed.

2. The method of claim 1, wherein the at least one current test load (LAST) comprises at least one pulse load of a current variable, at least one step change in load of a current variable, an alternating signal of a current variable or at least one ramp change in load of a current variable.

3. The method of claim 1, wherein at least one of the response signal (du(t)) of the battery, a difference in a response to two pulse loads (ddu(t)), a predetermined number of current test loads, a level of the applied current test loads (LAST) or a drop below a minimum value for a difference between voltage drops is determined.

4. The method of claim 1, wherein the at least one predefined criterion comprises at least one of the following:
   a temporal component comprising an elapse of a preset minimum or maximum duration,
   a load component which relates to the at least one current test load (LAST), or
   a response component which relates to the response signal (du(t)).

5. The method of claim 1, wherein the at least one predefined criterion comprises verifying at least one of the following: (a) whether elapse of a predetermined time has been reached, (b) whether a predetermined number of cycles of the application of the at least one current test load (LAST) have been reached, or (c) whether a predetermined value or course sequence for the response signal (du(t)) has been reached.

6. The method of claim 1, wherein there are a plurality of predefined criteria, at least one of the plurality of predefined criteria comprising verifying at least one of the following: (a) whether elapse of a predetermined time has been reached, (b) whether a predetermined number of cycles of the application of the current test load (LAST) have been reached, or (c) whether a predetermined value or course sequence for the response signal (du(t)) has been reached, another of the plurality of predefined criteria comprising verifying at least one of the following: (a) whether the temporal change variable (ddu(t)) has reached a certain threshold (X), or (b) whether a predetermined time (T) has elapsed, the method further comprising establishing of the operating state or issuing the error message dependent on the satisfaction of the plurality of predefined criteria.

7. The method of claim 6, wherein establishing of the operating state or issuing of the error message occurs dependent on the at least one current test load (LAST).

8. The method of claim 1, wherein energy for carrying out depassivation is drawn exclusively from the battery.

9. A battery powered system, comprising:
   a) a lithium-thionyl battery comprising an electrode,
   b) a controller in connection with the battery, the controller being adapted to apply at least one current test load (LAST) to the electrode of the battery, wherein at least one of a shape, a magnitude, or a point in time of the application of the at least one current test load (LAST) occurs dependent on a measurement a time dependent response signal (u(t), du(t)) of the battery, and energy of the at least one current test load (LAST) is drawn from the battery,
   c) a comparator in connection with the controller, the comparator being adapted to compare the response signal (u(t), du(t)) of the battery to the at least one current test load (LAST) to at least one predefined criterion, and
   d) an observer adapted to determine a temporal change variable (ddu(t)), which is calculated as a difference between a response signal (du(t2)) at time t2 and a response signal (du(t1)) at time t1 as: ddu(t2)=du(t2)−du(t1),
   wherein the battery powered system establishes an operating state or issues an error message depending on satisfaction of the at least one predefined criterion,
   wherein the controller further controls application of the at least one current test load (LAST).

10. The system of claim 9, wherein the controller (301) controls the application of the at least one current test load (LAST) based on at least one of a magnitude or a point in time, and wherein the energy of the at least one current test load (LAST) originates only from the battery.

11. The system of claim 9, wherein the system comprises at least one of the following: a gas measurement system, a defibrillator system, a pacemaker system, an electric measurement system, a toll system, a water detector system, a fire detector system, a current detector system, or an emergency lighting system.

12. The system of claim 9, wherein a current variable level (N) is measured for a time between 1 ms and 10 minutes, until further interaction.

13. The system of claim 12, wherein the current variable level (N) is a current intensity.

14. The system of claim 9, wherein a current variable level (N) is measured for a time between 75 ms and 500 ms, until further interaction.

15. The system of claim 9, wherein energy supply of the system occurs autonomously through the battery.

16. A device for use in connection with a battery powered system including a lithium-thionyl battery having an electrode, comprising:
   a) a controller in connection with the battery, the controller being adapted to apply at least one current test load (LAST) to the electrode of the battery, wherein at least one of a shape, a magnitude, or a point in time of the application of the at least one current test load (LAST) occurs dependent on a measurement of a time-dependent response signal (u(t), du(t)) of the battery, and energy of the at least one current test load (LAST) is drawn from the battery,
   b) a comparator in connection with the controller, the comparator being adapted to compare the response signal (u(t), du(t)) of the battery to the at least one current test load (LAST) to at least one predefined criterion, and
   c) an observer adapted to determine a temporal change variable (ddu(t)), which is calculated as a difference between a response signal (du(t2)) at time t2 and a response signal (du(t1)) at time t1 as: ddu(t2)=du(t2)−du(t1),
   wherein the device establishes an operating state (12) or issues an error message depending on satisfaction of the at least one predefined criterion, and
   wherein the controller further controls application of the at least one current test load (LAST).

* * * * *

UNITED STATES PATENT AND TRADEMARK OFFICE
CERTIFICATE OF CORRECTION

PATENT NO. : 10,141,581 B2  
APPLICATION NO. : 15/300862  
DATED : November 27, 2018  
INVENTOR(S) : Rene Klewer et al.

Page 1 of 1

It is certified that error appears in the above-identified patent and that said Letters Patent is hereby corrected as shown below:

On the Title Page

Column 2, Item (57) ABSTRACT, Line 6, delete "du(t)" and insert -- du(t)) --

Column 2, Item (57) ABSTRACT, Line 9, delete "du(t)" and insert -- du(t)) --

In the Claims

Column 11, Line 44, Claim 9, after "measurement" insert -- of --

Column 11, Line 44, Claim 9, delete "time dependent" and insert -- time-dependent --

Signed and Sealed this  
Twenty-sixth Day of February, 2019

Andrei Iancu  
*Director of the United States Patent and Trademark Office*